US 9,054,054 B2

(12) United States Patent
Park et al.

(10) Patent No.: US 9,054,054 B2
(45) Date of Patent: Jun. 9, 2015

(54) METHODS OF FORMING PATTERNS AND METHODS OF MANUFACTURING SEMICONDUCTOR DEVICES USING THE SAME

(75) Inventors: Min-Joon Park, Yongin-si (KR);
Seok-Hyun Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 865 days.

(21) Appl. No.: 13/164,215

(22) Filed: Jun. 20, 2011

(65) Prior Publication Data

US 2011/0312172 A1    Dec. 22, 2011

(30) Foreign Application Priority Data

Jun. 21, 2010 (KR) ........................ 10-2010-0058450

(51) Int. Cl.
| | | |
|---|---|---|
| *H01L 21/311* | (2006.01) | |
| *H01L 21/3213* | (2006.01) | |
| *H01L 21/308* | (2006.01) | |
| *H01L 27/115* | (2006.01) | |
| *H01L 21/3205* | (2006.01) | |
| *H01L 21/4763* | (2006.01) | |

(52) U.S. Cl.
CPC ...... *H01L 21/32139* (2013.01); *H01L 21/3086* (2013.01); *H01L 21/32136* (2013.01); *H01L 21/32137* (2013.01); *H01L 27/11541* (2013.01)

(58) Field of Classification Search
None
See application file for complete search history.

(56) References Cited

U.S. PATENT DOCUMENTS

| 2003/0207579 A1* | 11/2003 | Rattner et al. ................ 438/700 |
| 2005/0155951 A1* | 7/2005 | Suzuki et al. .................. 216/66 |
| 2007/0281477 A1 | 12/2007 | Lee et al. |
| 2008/0166843 A1* | 7/2008 | Korber .......................... 438/257 |

FOREIGN PATENT DOCUMENTS

| JP | 2008-078582 | 4/2008 |
| KR | 1020060094707 | 8/2006 |

* cited by examiner

*Primary Examiner* — Calvin Choi
(74) *Attorney, Agent, or Firm* — Myers Bigel Sibley & Sajovec, P.A.

(57) ABSTRACT

In a method forming patterns, a layer on a substrate is patterned by a first etching process using an etch mask to form a plurality of first preliminary patterns and a plurality of second preliminary patterns. The second preliminary patterns are spaced apart from each other at a second distance larger than a first distance at which the first preliminary patterns are spaced apart. First and second coating layers are formed on sidewalls of the first and second preliminary patterns, respectively, and the first and second coating layers and portions of the first and second preliminary patterns are removed by a second etching process using the etch mask to form a plurality of first patterns and a plurality of second patterns. The first patterns have widths that are smaller than widths of the first preliminary patterns. The first patterns may have generally vertical sidewalls relative to the substrate.

20 Claims, 10 Drawing Sheets

2ND DIRECTION ⊗ → 1ST DIRECTION

METHODS OF FORMING PATTERNS AND METHODS OF MANUFACTURING SEMICONDUCTOR DEVICES USING THE SAME

CROSS REFERENCE TO RELATED APPLICATIONS AND CLAIM OF PRIORITY

This application claims priority under 35 USC §119 to Korean Patent Application No. 10-2010-0058450 filed on Jun. 21, 2010 in the Korean Intellectual Property Office (KIPO), the disclosure of which is incorporated herein by reference in its entirety.

BACKGROUND

1. Field

Example embodiments relate to methods of forming patterns and methods of manufacturing semiconductor devices using the same. More particularly, example embodiments relate to methods of forming patterns having vertical sidewalls and methods of manufacturing semiconductor devices using the same.

2. Description of the Related Art

As semiconductor devices have become more highly integrated, methods of forming ever smaller patterns are needed. In an etching process for forming minute patterns, the patterns may be formed to have different sidewall profiles according to the density of the patterns, because of the loading effect. In general, patterns that are smaller and more closely spaced on a substrate are denser and thus are less susceptible to the loading effect, while patterns that are larger and more spaced apart are less dense, and thus are more susceptible to the loading effect.

That is, when a layer is etched to form patterns, some patterns having a relatively low density may be over-etched, so that the sidewalls of the patterns may not have a vertical profile, but instead may have an undercut shape. Conversely, if patterns having a relatively low density are etched so that the sidewalls of the patterns are vertical or nearly vertical, the sidewalls of patterns that are denser may be under-etched, and may therefore be wider than desired.

SUMMARY

Some example embodiments provide methods of forming patterns having vertical or nearly vertical sidewalls regardless of the density of the patterns.

Some example embodiments provide methods of manufacturing a semiconductor device including patterns having vertical or nearly vertical sidewalls regardless of the density of the patterns.

According to some example embodiments, there is provided a method of forming patterns. In the method, a layer is formed on a substrate. The layer is patterned by a first etching process using a mask to form a plurality of first preliminary patterns and a plurality of second preliminary patterns. The second preliminary patterns are spaced apart from each other at a second distance that is larger than a first distance at which the first preliminary patterns are spaced apart. A coating process is performed to form first and second coating layers on sidewalls of the first and second preliminary patterns, respectively. The first and second coating layers and portions of the first and second preliminary patterns are removed by a second etching process using the mask to form a plurality of first patterns having reduced widths compared to the first preliminary patterns. The first patterns may have vertical sidewalls, and the second patterns may have vertical sidewalls.

In some example embodiments, the coating process may be performed under a pressure of about 20 mTorr to about 500 mTorr.

In some example embodiments, the coating process may be performed using a source gas including $CH_xF_y$, $C_xF_y$, $CH_4$ and/or $SiCl_4$, where x and y are positive integers. These may be used alone or in a combination thereof.

In some example embodiments, the source gas may further include $O_2$.

In some example embodiments, the coating process may be performed using an inactive gas or $N_2$ in addition to the source gas.

In some example embodiments, the second preliminary patterns may have sidewalls that are vertical relative to a top surface of the substrate.

In some example embodiments, the first and second preliminary patterns may have sidewalls that are slanted relative to a top surface of the substrate. A portion of each sidewall of each first preliminary pattern that is not directly under the mask may have a width that is larger than the width of a portion of each sidewall of each second preliminary pattern that is not directly under the mask.

In example embodiments, the second coating layer may have a width that is larger than the width of the first coating layer.

In some example embodiments, the layer may include a conductive material.

According to some example embodiments, there is provided a method of manufacturing a semiconductor device. In the method, a tunnel insulation layer and a floating gate layer are sequentially formed on a substrate. The tunnel insulation layer and the floating gate layer are patterned by a first etching process using a mask to form a plurality of first preliminary structures and a plurality of second preliminary structures. The second preliminary structures are spaced apart from each other at a second distance that is larger than a first distance at which the first preliminary structures are spaced apart. A coating process is performed to form first and second coating layers on sidewalls of the first and second preliminary structures, respectively. The first and second coating layers and portions of the first and second preliminary structures are removed by a second etching process using the mask to form a plurality of first structures and a plurality of second structures. Each of the first structures has a first tunnel insulation layer pattern and a first floating gate sequentially stacked, and each of the second structures has a second tunnel insulation layer pattern and a second floating gate sequentially stacked. The first and second structures may have vertical sidewalls. Isolation layers are formed on the substrate and the mask is removed. A first dielectric layer pattern and a first control gate are sequentially formed on the first structures, and a second dielectric layer pattern and a second control gate are sequentially formed on the second structures.

In some example embodiments, the coating process may be performed under a pressure of about 20 mTorr to about 500 mTorr.

In some example embodiments, the coating process may be performed using a source gas including $CH_xF_y$, $C_xF_y$, $CH_4$ and/or $SiCl_4$, where x and y are positive integers. These may be used alone or in a combination thereof.

In some example embodiments, the source gas may further include $O_2$.

In some example embodiments, the second preliminary structures may be formed to have sidewalls vertical to a top surface of the substrate.

In some example embodiments, the first and second preliminary structures may have sidewalls that are slanted relative to a top surface of the substrate. A portion of each sidewall of each first preliminary structure that is not directly under the hard mask may have a width that is larger than a width of a portion of each sidewall of each second preliminary structure that is not directly under the hard mask.

In some example embodiments, the second coating layer may have a width larger than that of the first coating layer.

In some example embodiments, the substrate may be divided into a cell region and a peripheral circuit region. The first structures, the first dielectric layer pattern and the first control gate may be formed in the cell region, and the second structures, the second dielectric layer pattern and the second control gate may be formed in the peripheral circuit region.

In some example embodiments, when the isolation layers are formed and the mask is removed, upper portions of the substrate may be partially removed using the mask and the first and second structures as an etching mask to form trenches. An insulation layer covering the hard mask and the first and second structures may be formed to fill the trenches. An upper portion of the insulation layer and the mask may be removed to form the isolation layers.

According to some example embodiments, after performing a first etching process for forming patterns, a coating process may be performed under a high pressure to form a coating layer having a relatively thick thickness on sidewalls of some of the patterns that are relatively formed at a low density. Thus, even though the sidewalls of the patterns having a low density may be over-etched in a subsequent etching process, the patterns may have vertical sidewalls as a result.

BRIEF DESCRIPTION OF THE DRAWINGS

Example embodiments will be more clearly understood from the following detailed description taken in conjunction with the accompanying drawings.

FIGS. 1, 2, 2A, 3 and 4 are cross-sectional views illustrating methods of forming patterns in accordance with some example embodiments;

FIGS. 5 to 7 are cross-sectional views illustrating methods of forming patterns in accordance with other some example embodiments;

FIGS. 8 to 17 are cross-sectional views illustrating methods of forming a semiconductor device in accordance with some example embodiments; and FIG. 18 is a block diagram illustrating a system in accordance with some example embodiments.

DETAILED DESCRIPTION OF THE EMBODIMENTS

Figure 1:
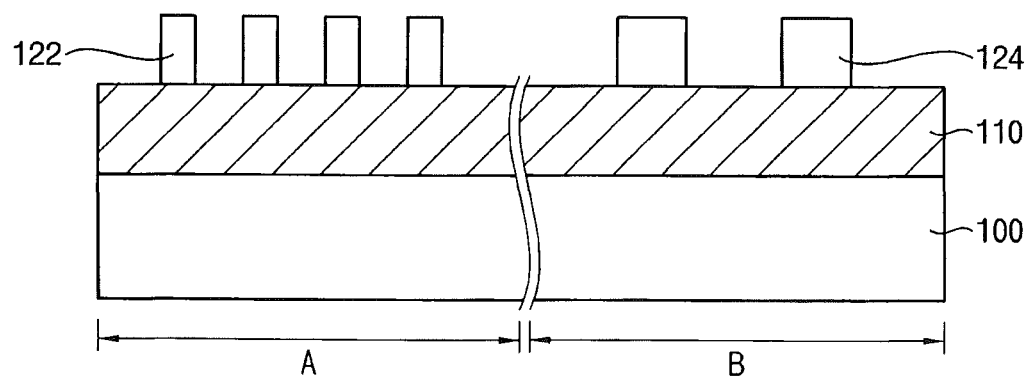
FIGS. 1 to 18 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 4 are cross-sectional views illustrating methods of forming patterns in accordance with some example embodiments.

Referring to FIG. 1, a conductive layer 110 may be formed on a substrate 100 that may be divided into a first region A and a second region B, and first and second hard masks 122 and 124 may be formed on the conductive layer 110. The conductive layer 110 may be an object layer that is to be etched.

The substrate 100 may include a semiconductor substrate, e.g., a silicon substrate, a germanium substrate or a silicon-germanium substrate, a substrate having a semiconductor layer, e.g., a silicon-on-insulator (SOI) substrate or a germanium-on-insulator (GUI) substrate, or a single crystalline metal oxide substrate.

The conductive layer 110 may be formed using doped polysilicon, a metal, a metal nitride, and the like.

The first and second hard masks 122 and 124 may be formed using a nitride. The first hard mask 122 may be formed on the substrate 100 in the first region A, and the second hard mask 124 may be formed on the substrate 100 in the second region B. The first hard masks 122 may be formed to be spaced apart from each other more closely than the second hard masks 124.

Figure 2:
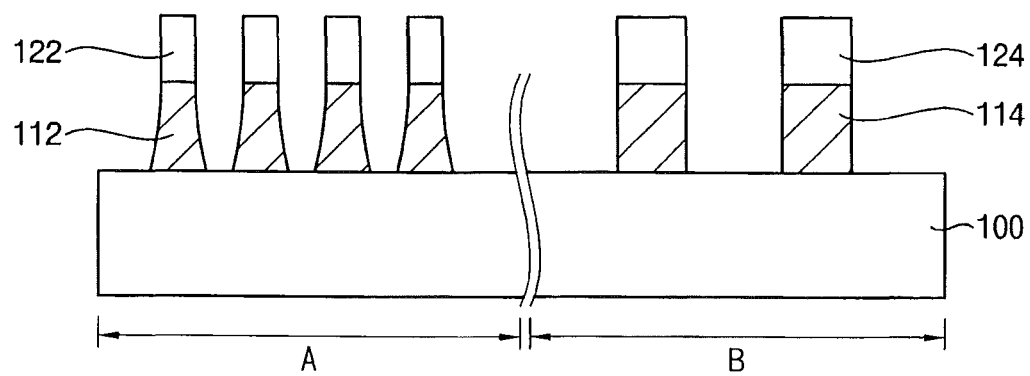

Referring to FIG. 2, the conductive layer 110 may be patterned using the first and second hard masks 122 and 124 as an etching mask by a first etching process to form first preliminary conductive patterns 112 and second preliminary conductive patterns 114 on the substrate 100 in the first and second regions A and B, respectively. The first preliminary conductive patterns 112 may be formed to be spaced apart from each other more closely than the second preliminary conductive patterns 114.

In example embodiments, the second preliminary conductive patterns 114 may be formed to have vertical sidewalls with respect to a top surface of the substrate 100, and the first preliminary conductive patterns 112 may be formed to have slanted sidewalls with respect to the top surface of the substrate 100. That is, the first preliminary conductive patterns 112 may be formed to have a tapered shape.

Figure 2A:
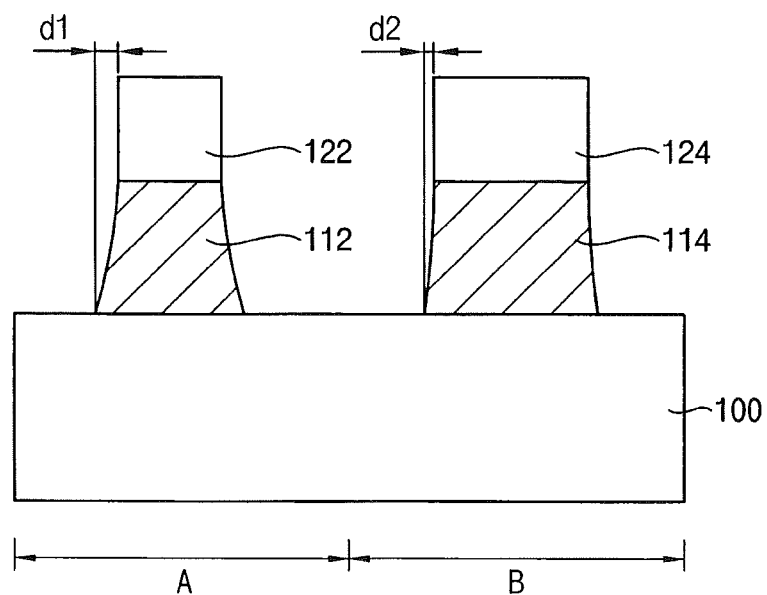

FIG. 2A is a detail view of portions of a substrate 100 including first and second preliminary conductive patterns 112, 114, and first and second hard masks 122, 124 in accordance with some embodiments. As shown in FIG. 2A, the first preliminary conductive pattern 112 may have a width that extends horizontally away from a sidewall of the first hard mask 122 by a distance d1, while the second preliminary conductive pattern 114 may have a width that extends horizontally away from a sidewall of the second hard mask 124 by a distance d2 that is smaller than d1.

Figure 3:
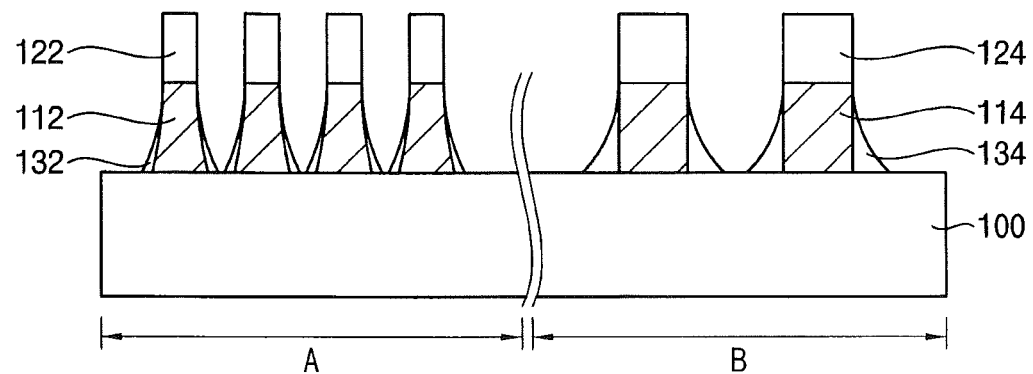

Referring to FIG. 3, by performing a coating process, a first coating layer 132 may be formed on the sidewalls of the first preliminary conductive patterns 112 and a second coating layer 134 may be formed on the sidewalls of the second preliminary conductive patterns 114. In example embodiments, the second coating layer 134 may be formed to have a width larger than that of the first coating layer 132.

The coating process may be performed using a source gas including a $CH_xF_y$ (where x and y are positive integers) based gas, such as $CH_3F$, $CH_2F_2$ or $CHF_3$, a $C_xF_y$ (where x and y are positive integers) based gas, $CH_4$, $SiCl_4$ and/or a mixture gas thereof. In an example embodiment, the source gas may further include $O_2$ gas.

The coating process may be performed under a pressure of about 20 mTorr to about 500 mTorr. If the coating process is performed under a pressure below the above pressure, the first coating layer 132 on the sidewalls of the first preliminary conductive patterns 112 may be formed to have a thickness similar to that of the second coating layer 134 on the sidewalls of the second preliminary conductive patterns 114, and thus in a second etching process subsequently performed, the second preliminary conductive patterns 114 may be over-etched to have an undercut shape because of the loading effect. However, the coating process may be performed under the above pressure, and thus the second coating layer 134 may be formed to have a width larger than that of the first coating layer 132.

In an example embodiment, the source gas may be provided at a flow rate of about 10 sccm to about 500 sccm, and the coating process may be performed at an RF source power of about 100 Watts to about 200 Watts and a bias power of about 0 Watts to about 100 Watts. In an example embodiment, an inactive gas such as He, Ne, Ar, Xe, etc. or $N_2$ gas may be further provided at a flow rate of about 10 to about 1,000 sccm.

Figure 4:
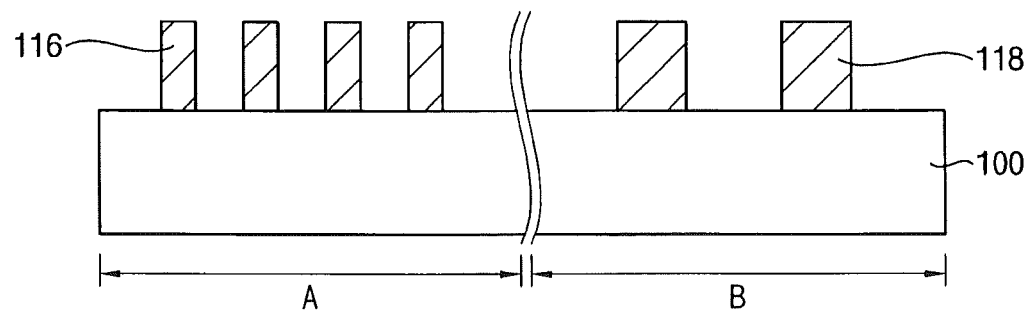

Referring to FIG. 4, the second etching process may be performed to remove the first and second coating layers 132 and 134 and a portion of the sidewalls of the first preliminary conductive patterns 112. Thus, first and second conductive patterns 116 and 118 having vertical sidewalls may be formed on the substrate 100 in the first and second regions A and B, respectively. That is, the second coating layer 134 may have a width larger than that of the first coating layer 132, and thus the second preliminary conductive patterns 114 may not be over-etched even due to the loading effect. Accordingly, the first and second conductive patterns 116 and 118 may be formed to have sidewalls that are generally vertical relative to a top surface of the substrate 100. The first and second hard masks 122 and 124 may be removed.

In an example embodiment, the coating process and the second etching process may be performed simultaneously.

According to the above-illustrated method, even though the conductive patterns 116 and 118 are formed with different densities (i.e., different widths and/or pitches) on the substrate 100, the conductive patterns 116 and 118 may have vertical sidewalls.

Figure 5:
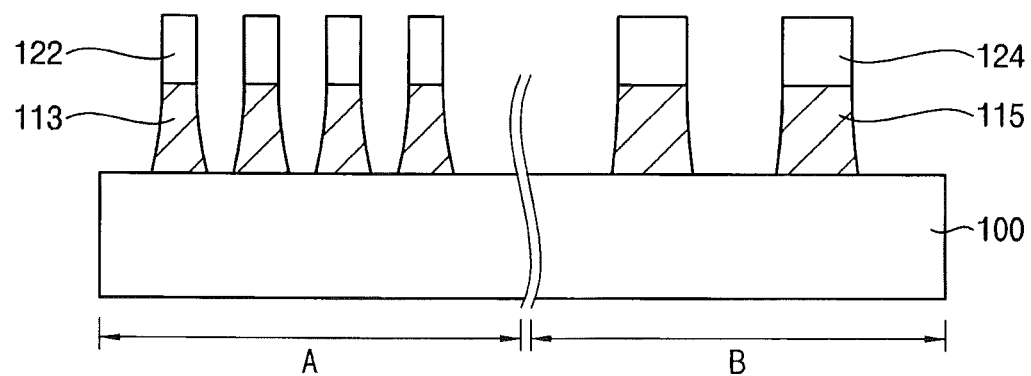
Figure 6:
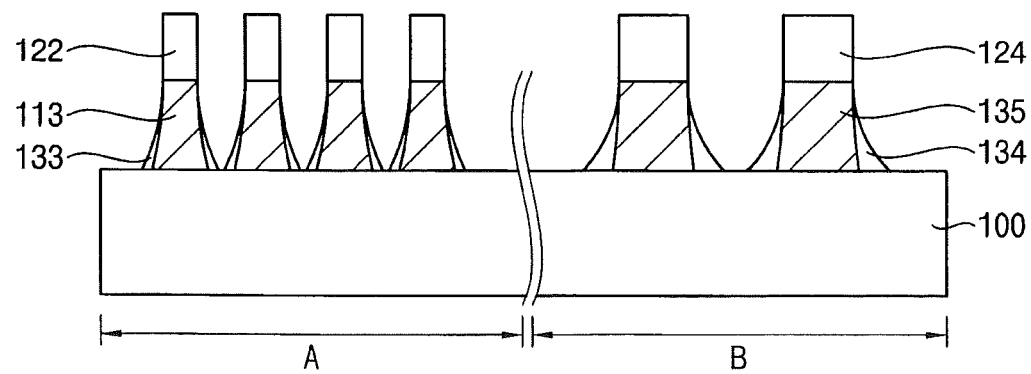
Figure 7:
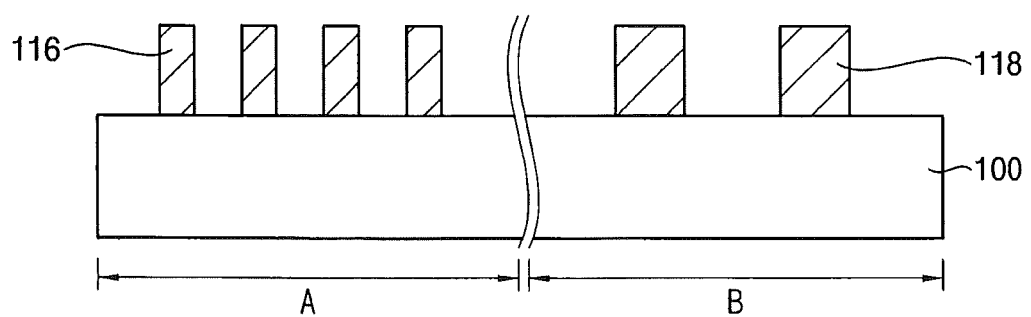

FIGS. 5 to 7 are cross-sectional views illustrating methods of forming patterns in accordance with some other example embodiments. Detailed explanations of processes substantially the same as or similar to those illustrated with reference to FIGS. 1 to 4 are omitted here.

First, as illustrated with reference to FIG. 1, a conductive layer 110 and first and second hard masks 122 and 124 may be formed on a substrate 100 in first and second A and B, respectively.

Referring to FIG. 5, a third etching process may be performed using the first and second hard masks 122 and 124 as an etching mask to pattern the conductive layer 110, so that third preliminary conductive patterns 113 and fourth preliminary conductive patterns 115 may be formed on the substrate 100 in the first and second regions A and B, respectively. The third preliminary conductive patterns 113 may be formed to be spaced apart from each other more closely than the fourth preliminary conductive patterns 115.

In example embodiments, the third and fourth preliminary conductive patterns 113 and 115 may be formed to have slanted sidewalls with respect to a top surface of the substrate 100. In this case, due to the loading effect, a portion of each sidewall of each third preliminary conductive pattern 113 that is not directly under the first hard mask 122 may have a width larger than that of a portion of each sidewall of each fourth preliminary conductive pattern 114 that is not directly under the second hard mask 124, as shown in FIG. 2A.

Referring to FIG. 6, by performing a coating process, a third coating layer 133 may be formed on the sidewalls of the third preliminary conductive patterns 113 and a fourth coating layer 135 may be formed on the sidewalls of the fourth preliminary conductive patterns 115. In example embodiments, the fourth coating layer 134 may be formed to have a width larger than that of the third coating layer 133.

The coating process may be performed using a source gas including a $CH_xF_y$ (where x and y are positive integers) based gas, such as $CH_3F$, $CH_2F_2$ or $CHF_3$, a $C_xF_y$ (where x and y are positive integers) based gas, $CH_4$, $SiCl_4$ and/or a mixture gas thereof. In an example embodiment, the source gas may further include $O_2$ gas. The coating process may be performed under a pressure of about 20 mTorr to about 500 mTorr.

Referring to FIG. 7, a fourth etching process may be performed to remove the third and fourth coating layers 133 and 135 and a portion of the sidewalls of the third and fourth preliminary conductive patterns 113 and 115. Thus, first and second conductive patterns 116 and 118 having vertical sidewalls may be formed on the substrate 100 in the first and second regions A and B, respectively. The first and second hard masks 122 and 124 may be removed.

In an example embodiment, the coating process and the fourth etching process may be performed simultaneously.

Methods of forming a pattern by patterning a conductive layer have been illustrated. However, the scope of the present inventive concept may not be limited thereto, and may be applied to, e.g., a method of forming a pattern by patterning an insulation layer.

FIGS. 8 to 17 are cross-sectional views illustrating methods of forming a semiconductor device in accordance with some example embodiments.

Figure 8:
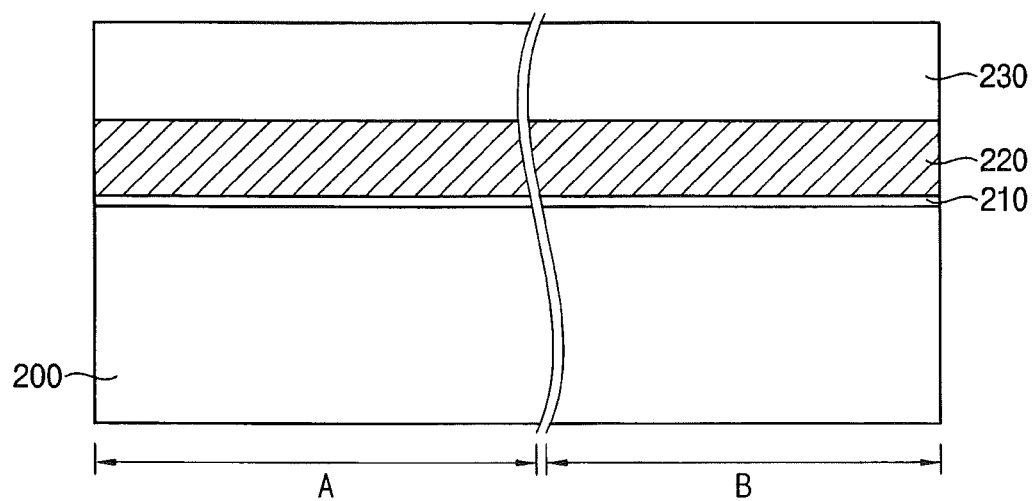

Referring to FIG. 8, a substrate 200 divided into a first region A and a second region B may be provided. In example embodiments, the first region A may serve as a cell region in which memory cells may be formed, and the second region B may serve as a peripheral circuit region in which peripheral circuits or logic circuits may be formed.

A tunnel insulation layer 210, a floating gate layer 220 and a hard mask layer 230 may be formed on the substrate 200.

In some example embodiments, the tunnel insulation layer 210 may be formed by performing thermal oxidation or radical oxidation on a top surface of the substrate 200 or by depositing an oxide on the substrate 200. In an example embodiment, the tunnel insulation layer 210 may be formed to have a thickness of about 50 to abut 100 Å.

In some example embodiments, the floating gate layer 220 may be formed using doped polysilicon or a metal. In an example embodiment, the floating gate layer 220 may be formed by a low pressure chemical vapor deposition (LPCVD) process using polysilicon. In the LPCVD process, impurities may be doped in-situ or ex-situ.

In some example embodiments, the hard mask layer 230 may be formed using a nitride or an oxynitride.

Figure 9:
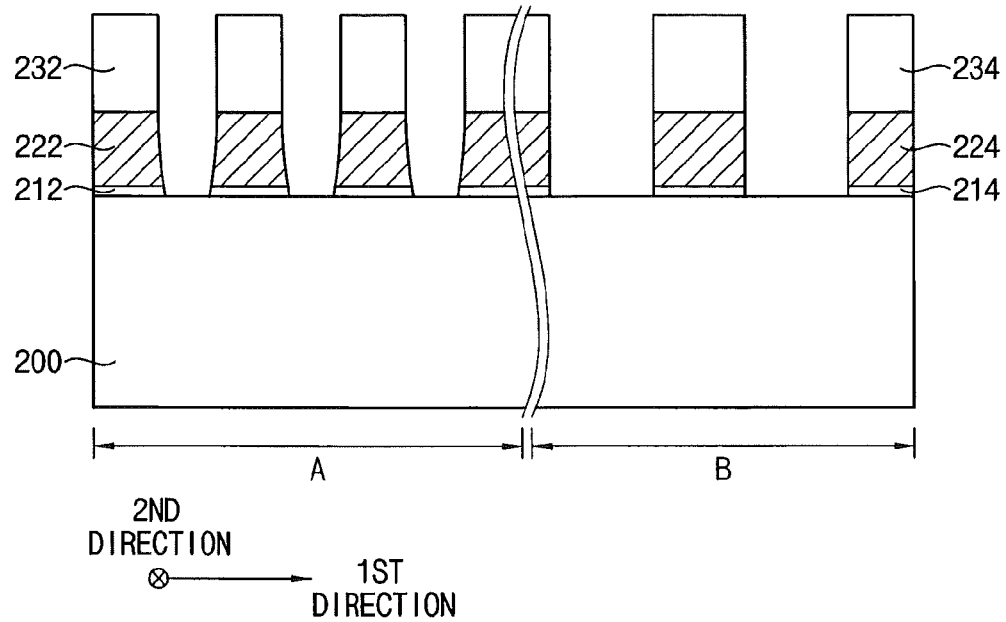

Referring to FIG. 9, the hard mask layer 230 may be patterned by a photolithography process to form first and second hard masks 232 and 234 in the first and second regions A and B, respectively. The floating gate layer 220 and the tunnel insulation layer 210 may be patterned by a first etching process using the first and second hard masks 232 and 234 as an etching mask to form a first preliminary floating gate 222 and a first preliminary tunnel insulation layer pattern 212 in the first region A, and to form a second preliminary floating gate 224 and a second preliminary tunnel insulation layer pattern 214 in the second region B.

Hereinafter, the first preliminary tunnel insulation layer pattern 212 and the first preliminary floating gate 222 may be referred to as a first preliminary structure, and the second preliminary tunnel insulation layer pattern 214 and the second preliminary floating gate 224 may be referred to as a second preliminary structure. In example embodiments, a plurality of first preliminary structures may be formed on the substrate 200 in a first direction parallel to a top surface of the substrate 200 to be spaced apart from each other. Each of the first preliminary structures may have a linear shape extending in a second direction perpendicular to the first direction.

Likewise, a plurality of second preliminary structures may be formed on the substrate 200 in the first direction to be spaced apart from each other. Each of the second preliminary structures may have a linear shape extending in the second direction. Alternatively, the second preliminary structure may be formed to have an island shape.

In example embodiments, a distance between the first preliminary structures in the first region A may be smaller than that between the second preliminary structures in the second region B.

In example embodiments, the second preliminary structures may be formed to have vertical sidewalls with respect to a top surface of the substrate 200, and the first preliminary structures may be formed to have slanted sidewalls with respect to the top surface of the substrate 200. That is, the first preliminary structures may be formed to have a tapered shape.

Figure 10:
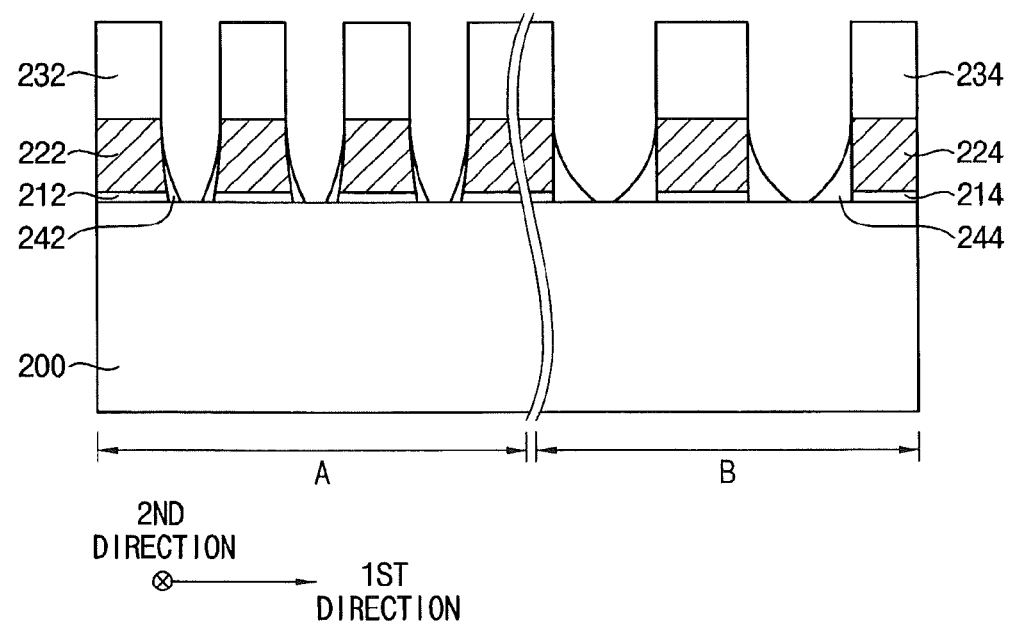

Referring to FIG. 10, by performing a coating process, a first coating layer 242 may be formed on the sidewalls of the first preliminary structures and a second coating layer 244 may be formed on the sidewalls of the second preliminary structures. In example embodiments, the second coating layer 244 may be formed to have a width larger than that of the first coating layer 242.

The coating process may be performed using a source gas including a $CH_xF_y$ (where x and y are positive integers) based gas, such as $CH_3F$, $CH_2F_2$ or $CHF_3$, a $C_xF_y$ (where x and y are positive integers) based gas, $CH_4$, $SiCl_4$ and/or a mixture gas thereof. In some example embodiments, the source gas may further include $O_2$ gas.

Figure 11:
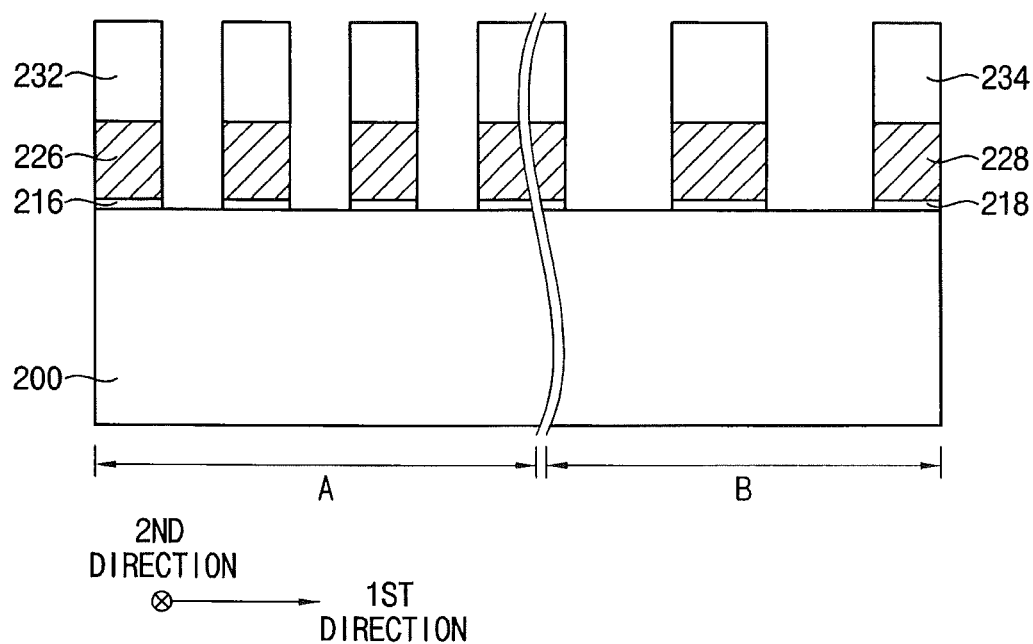

Referring to FIG. 11, a second etching process may be performed to remove the first and second coating layers 242 and 244 and a portion of the sidewalls of the first preliminary structures. Thus, first and second structures having vertical sidewalls may be formed on the substrate 200 in the first and second regions A and B, respectively. Each of the first structures may include a first tunnel insulation layer pattern 216 and a first floating gate 226 sequentially stacked on the substrate 200, and each of the second structures may include a second tunnel insulation layer pattern 218 and a second floating gate 228 sequentially stacked on the substrate 200.

In an example embodiment, the coating process and the second etching process may be performed simultaneously.

According to the above-illustrated method, even though the first and second structures are formed with a different density, the first and second structures may have generally vertical sidewalls.

Until now, a method of forming the first and second structures using the methods illustrated with reference to FIGS. 1 to 4 has been illustrated, however, the method of forming the first and second structures may be also performed using the methods illustrated with reference to FIGS. 5 to 7.

Figure 12:
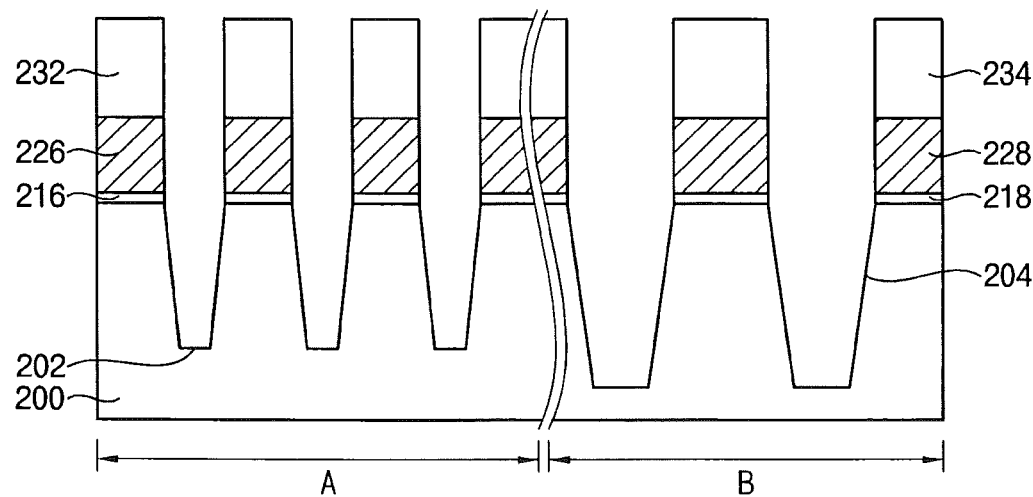

Referring to FIG. 12, upper portions of the substrate 200 may be etched using the first and second hard masks 232 and 234 and the first and second structures as an etching mask to form first trenches 202 and second trenches 204 on the substrate 200 in the first and second regions A and B, respectively.

Figure 13:
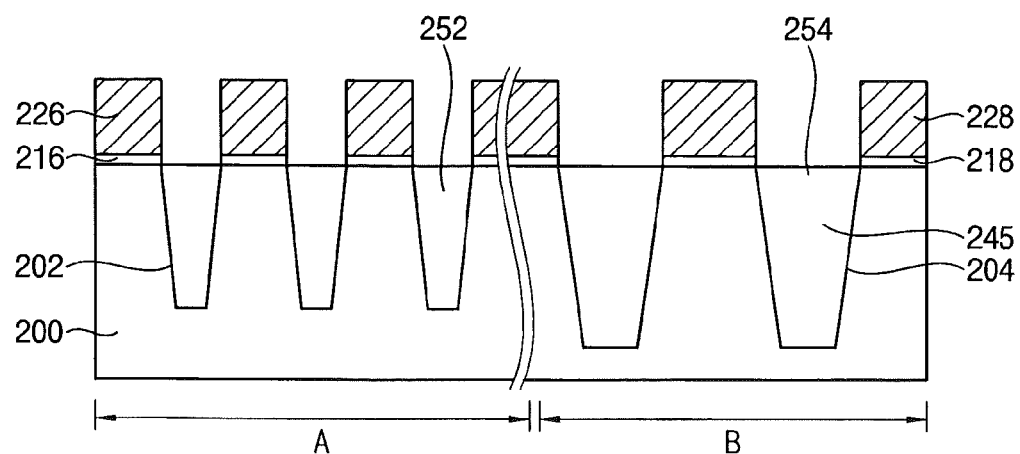

Referring to FIG. 13, an insulation layer may be formed on the substrate 200, the structures and the masks 232 and 234 to fill the trenches 202 and 204 and spaces between the structures. The insulation layer may be formed using an oxide such as boro phospho silicate glass (BPSG), tonen silazene (TOSZ), flowable oxide (FOX), spin on glass (SOG), etc. An upper portion of the insulation layer may be removed until the first and second tunnel insulation layer patterns 216 and 218 are exposed to form first and second isolation layers 252 and 254 filling the first and second trenches 202 and 204, respectively. When the upper portion of the insulation layer may be removed, the first and second hard masks 232 and 234 may be also removed.

Figure 14:
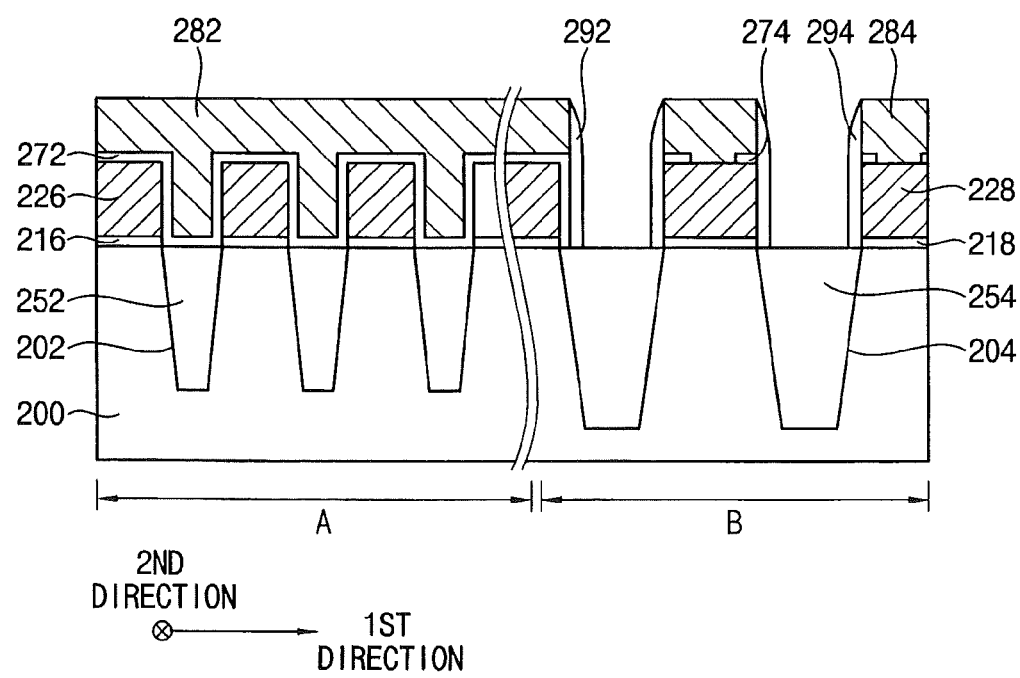

Referring to FIG. 14, a dielectric layer may be formed on the first and second floating gates 226 and 228, the first and second tunnel insulation layer patterns 216 and 218, and the first and second isolation layers 252 and 254.

In an example embodiment, the dielectric layer may be formed using an oxide and a nitride to have a multi-layered structure including oxide layer/nitride layer/oxide layer. Alternatively, the dielectric layer may be formed using a metal oxide having a high dielectric constant, e.g., hafnium oxide, titanium oxide, tantalum oxide, zirconium oxide, aluminum oxide, etc. In an example embodiment, the dielectric layer may be formed to have a thickness of about 100 to about 200 Å.

In example embodiments, a portion of the dielectric layer in the second region B may be removed. Particularly, a portion of the dielectric layer on the second floating gate 228 may be partially removed, and a portion of the dielectric layer on the second isolation layer 254 may be removed. Thus, a second dielectric layer pattern 274 may be formed on the second floating gate 228. A portion of the dielectric layer in the first region A may be referred to as a first dielectric layer pattern 272.

A control gate layer may be formed on the first and second dielectric layer patterns 272 and 274, the second floating gate 228 and the second isolation layer 254.

The control gate layer may be formed using doped polysilicon, a metal, a metal nitride and/or a metal silicide. Alternatively, the control gate layer may be formed to have a multi-layered structure including a doped polysilicon layer, an ohmic layer, a diffusion barrier layer, an amorphous layer and a metal layer. For example, the ohmic layer may be formed using titanium, tantalum, tungsten, molybdenum or an alloy thereof, the diffusion barrier layer may be formed using tungsten nitride, titanium nitride, tantalum nitride, molybdenum nitride, etc., the amorphous layer may be formed using a refractory metal silicide such as amorphous tungsten silicide, amorphous titanium silicide, amorphous molybdenum silicide or amorphous tantalum silicide, and the metal layer may be formed using tungsten, titanium, tantalum, molybdenum or an alloy thereof. In an example embodiment, the control gate layer may be formed to a thickness of about 500 to about 1,000 Å.

By patterning the control gate layer, a first control gate 282 may be formed on the first dielectric layer pattern 272, and a second control gate 284 may be formed on the second dielectric layer pattern 274 and the second floating gate 228. Simultaneously or using the first and second control gates 282 and 284 as an etching mask, the first and second dielectric layer patterns 272 and 274, the first and second floating gates 226 and 228, and the first and second tunnel insulation layer patterns 216 and 218 may be patterned.

Thus, in example embodiments, a plurality of first control gates 282 may be formed to be spaced apart from each other in the second direction, and each of the first control gates 282 may be formed to have a linear shape extending in the first direction. Likewise, a plurality of first dielectric layer patterns 272 may be formed to be spaced apart from each other in the second direction, and each of the first dielectric layer patterns 272 may be formed to have a linear shape extending in the first direction. The first floating gates 226 and the first tunnel insulation layer patterns 216 may be formed to have an island shape. The first tunnel insulation layer pattern 216, the first floating gate 226, the first dielectric layer pattern 272 and the first control gate 282 may define a first gate structure.

In example embodiments, the second control gate 284, the second dielectric layer pattern 274, the second floating gate 228 and the second tunnel insulation layer pattern 218 may be formed to have an island shape. The second tunnel insulation layer pattern 218, the second floating gate 228, the second dielectric layer pattern 274 and the second control gate 284 may define a second structure.

Impurities may be implanted into the substrate 200 to form a lightly doped impurity region (not shown) at upper portions of the substrate 200 adjacent to the first and second structures.

First and second spacers 292 and 294 may be formed on sidewalls of the first and second gate structures, respectively. Particularly, after forming a spacer layer covering the first and second gate structures on the substrate 200 and the isolation layers 252 and 254, the spacer layer may be etched by an anisotropic etching process. In example embodiments, the spacer layer may be formed using middle temperature oxide (MTO) to have a thickness of about 500 Å.

Impurities may be implanted into the substrate 200 using the spacers 292 and 294 as an ion implantation mask to form a highly doped impurity region at upper portions of the substrate 200 adjacent to the first and second gate structures. The lightly doped impurity region and the highly doped impurity region may form a lightly doped drain (LDD) structure and serve as a source/drain region.

Figure 15:
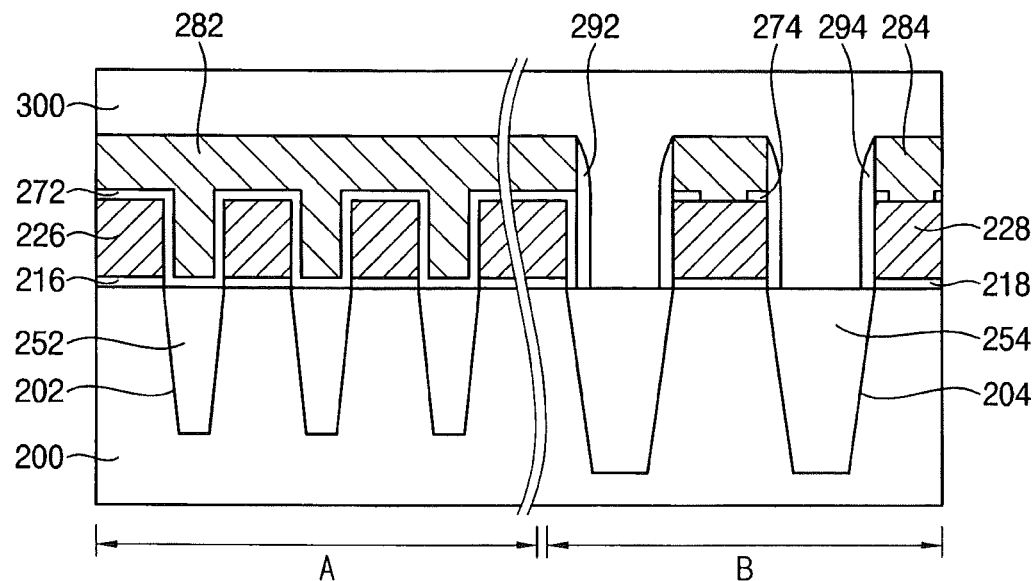

Referring to FIG. 15, a first insulating interlayer 300 covering the first and second gate structures and the first and second spacers 292 and 294 may be formed on the substrate 200 and the isolation layers 252 and 254. The first insulating interlayer 300 may be formed using an oxide by a chemical vapor deposition (CVD) process.

In example embodiments, the first insulating interlayer 300 may be formed by a high density plasma chemical vapor deposition (HDP-CVD) process. In an example embodiment, a first HDP-CVD process may be performed to form a first layer having a thickness of about 2,000 Å, and a wet etching process may be performed. A second HDP-CVD process may be performed to form a second layer having a thickness above about 6,000 Å, and a planarization process may be performed on an upper portion of the second layer. A capping layer (not shown), an organic layer (not shown) and an anti-reflection layer (not shown) may be further formed on the first insulating interlayer 300.

Figure 16:
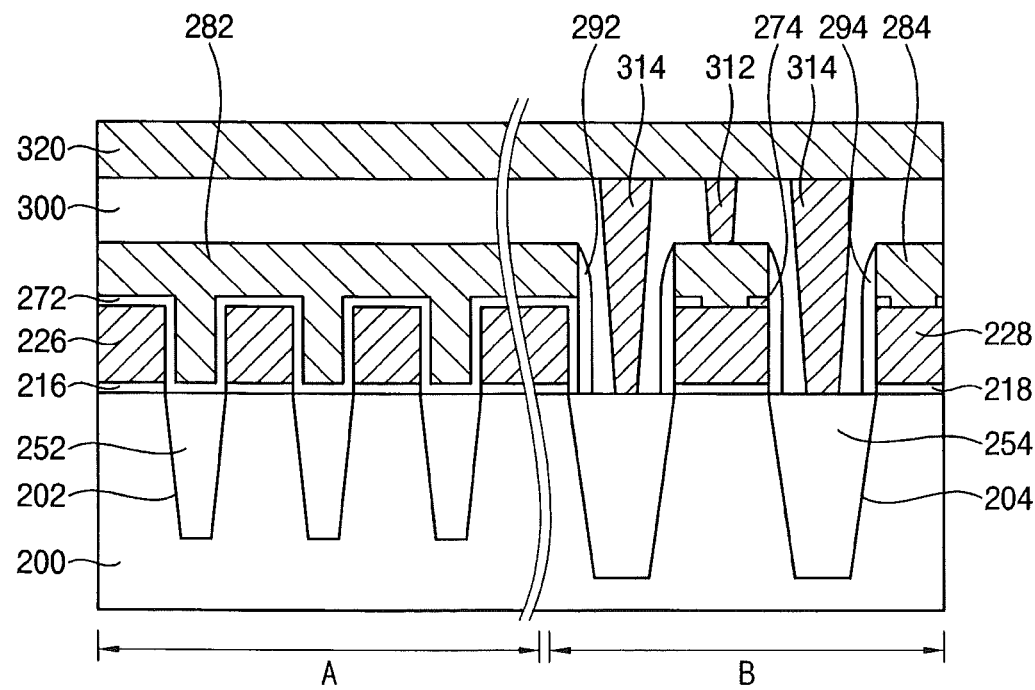

Referring to FIG. 16, the first insulating interlayer 300 may be partially etched to form a first opening (not shown) exposing the second control gate 284 and the second isolation layer 254. After forming a first conductive layer on the second control gate 284, the second isolation layer 254 and the first insulating interlayer 300 to fill the first opening, an upper portion of the first conductive layer on the first insulating interlayer 300 may be removed to form first and second plugs 312 and 314. The first conductive layer may be formed using aluminum, tungsten, copper or doped polysilicon.

After forming a second conductive layer on the first insulating interlayer 300 and the first and second plugs 312 and 314, the second conductive layer may be patterned to form a first wiring 320. The second conductive layer may be formed using aluminum, tungsten, copper or doped polysilicon. In an example embodiment, the first wiring 320 may be formed to have a linear shape extending in the first direction and serve as a bit line.

Figure 17:
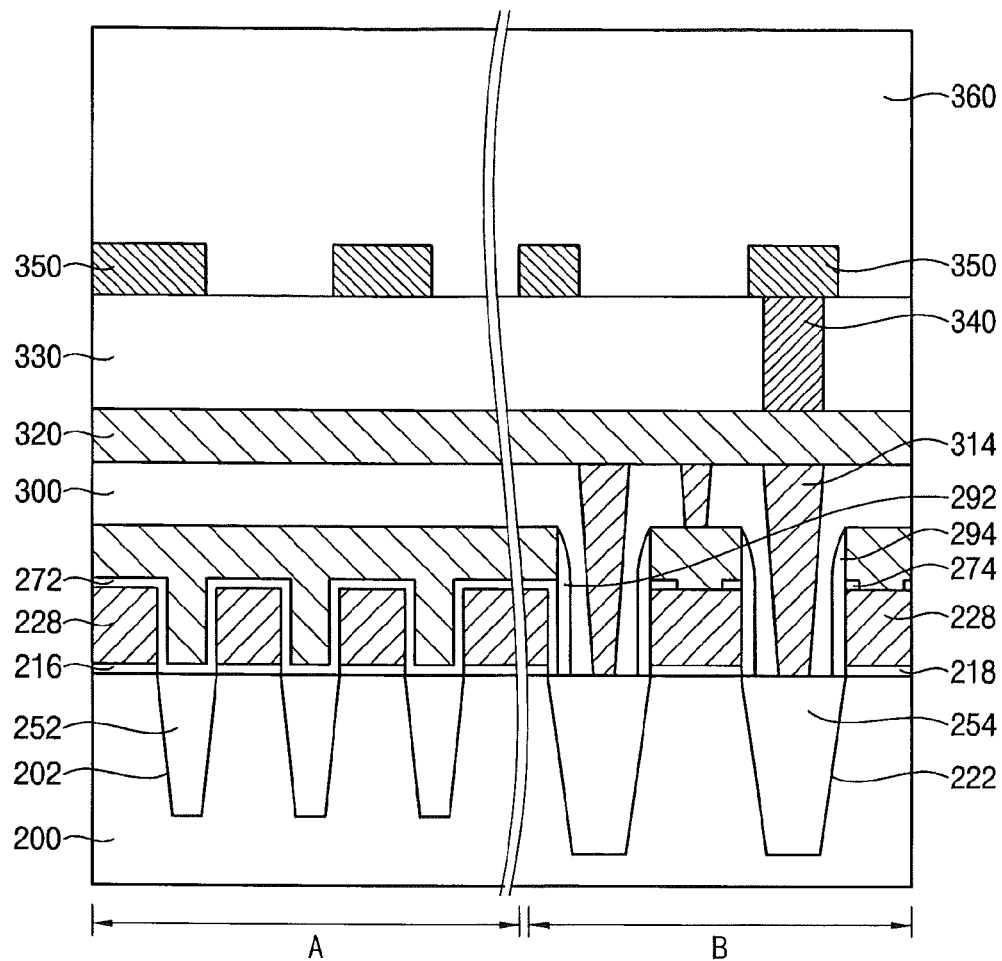

Referring to FIG. 17, a second insulating interlayer 330 covering the first wiring 320 may be formed on the first insulating interlayer 300. In example embodiments, the second insulating interlayer 330 may be formed using a material substantially the same as that of the first insulating interlayer 300. The second insulating interlayer 330 may be partially removed to form a second opening (not shown) exposing the first wiring 320. After forming a third conductive layer on the first wiring 320 and the second insulating interlayer 330 to fill the second opening, an upper portion of the third conductive layer on the second insulating interlayer 330 may be removed to form a third plug 340. The third conductive layer may be formed using aluminum, tungsten, copper or doped polysilicon.

After forming a fourth conductive layer on the second insulating interlayer 330 and the third plug 340, the fourth conductive layer may be patterned to form a second wiring 350. The fourth conductive layer may be formed using aluminum, tungsten, copper or doped polysilicon. In an example embodiment, a plurality of second wirings 350 may be formed, and the second wirings 350 may have an island shape.

A protection layer 360 covering the second wiring 350 may be formed on the second insulating interlayer 330 to complete the semiconductor device.

Until now, a method of manufacturing a floating gate type flash memory device has been illustrated, however, the scope of the present inventive concept may be applied to other types of memory devices such as a charge trapping type flash memory device including a tunnel insulation layer pattern, a charge trapping layer pattern, a blocking layer pattern and a gate electrode sequentially stacked, a NOR flash memory device, a phase-change random access memory (PRAM) device or a dynamic random access memory (DRAM) device.

Figure 18:
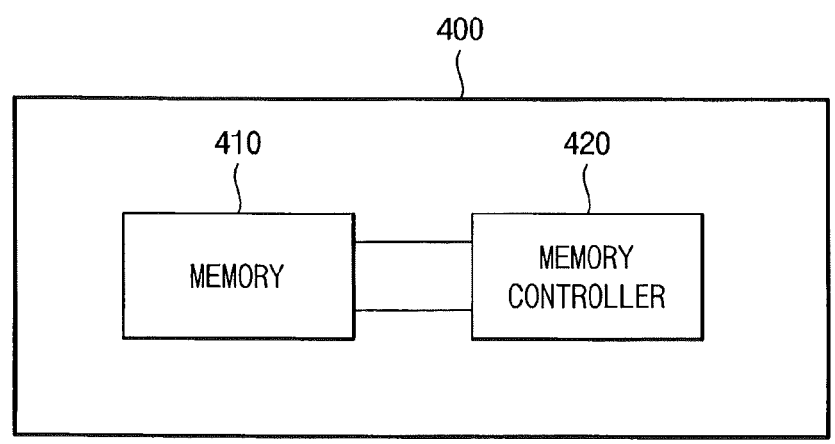

FIG. 18 is a block diagram illustrating a system in accordance with example embodiments.

Referring to FIG. 18, a system 400 may include a memory 410 and a memory controller 420.

The memory 410 may include patterns having vertical sidewalls regardless of the density of the patterns.

The memory controller 420 may provide the memory 410 with an input signal for controlling the operation of the memory 410. For example, when the memory 410 is a NAND flash memory device, the memory controller 420 may provide the memory 410 with a command (CMD) signal and an address (ADD) signal. Alternatively, when the memory 410 is a NOR flash memory device, the memory controller 420 may provide the memory 410 with a CMD signal, an ADD signal, an input/output data (DQ) and a high voltage (VPP) signal. As described above, the memory controller 420 may control the memory 410 by providing various types of control signals thereto.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming patterns, comprising:
   etching a layer on a substrate using a mask to form a plurality of first preliminary patterns that are spaced apart from each other by a first distance and a plurality of second preliminary patterns that are spaced apart from each other by a second distance that is larger than the first distance, wherein the first preliminary patterns have a first width;
   forming first and second coating layers on sidewalls of the first and second preliminary patterns, respectively, wherein the second coating layer has a width adjacent the substrate that is larger than a width of the first coating layer adjacent the substrate; and
   etching the first and second coating layers and portions of the first preliminary patterns using the mask to form a plurality of first patterns having vertical sidewalls and a plurality of second patterns having vertical sidewalls, wherein the first patterns have a second width that is less than the first width of the first preliminary patterns.

2. The method of claim 1, wherein the coating process is performed under a pressure of about 20 mTorr to about 500 mTorr.

3. The method of claim 1, wherein the coating process is performed using a source gas comprising $CH_xF_y$, $C_xF_y$, $CH_4$ and/or $SiCl_4$,
   and wherein x and y are positive integers.

4. The method of claim 1, wherein the source gas further includes $O_2$.

5. The method of claim 3, wherein coating the first and second preliminary patterns is performed using an inactive gas or $N_2$ in addition to the source gas.

6. The method of claim 1, wherein the second preliminary patterns have sidewalls that are generally vertical relative to a top surface of the substrate.

7. The method of claim 1, wherein the first and second preliminary patterns have sidewalls that are slanted relative to a top surface of the substrate; and
   wherein a portion of each sidewall of each first preliminary pattern that is not directly under the mask has a width that is larger than a width of a portion of each sidewall of each second preliminary pattern that is not directly under the mask.

8. The method of claim 1, wherein the layer includes a conductive material.

9. The method of claim 1, wherein the first patterns have generally vertical sidewalls relative to a top surface of the substrate.

10. A method of manufacturing a semiconductor device, comprising:

sequentially forming a tunnel insulation layer and a floating gate layer on a substrate;

patterning the tunnel insulation layer and the floating gate layer by a first etching process using a mask to form a plurality of first preliminary structures and a plurality of second preliminary structures, the second preliminary structures being spaced apart from each other at a second distance larger than a first distance at which the first preliminary structures are spaced apart;

forming first and second coating layers on sidewalls of the first and second preliminary structures, respectively, wherein the second coating layer has a width adjacent the substrate that is larger than a width of the first coating layer adjacent the substrate;

removing the first and second coating layers and portions of the first and second preliminary structures by a second etching process using the mask to form a plurality of first structures having vertical sidewalls and a plurality of second structures having vertical sidewalls, each of the first structures having a first tunnel insulation layer pattern and a first floating gate sequentially stacked, each of the second structures having a second tunnel insulation layer pattern and a second floating gate sequentially stacked, and the first and second structures having generally vertical sidewalls relative to a top surface of the substrate;

forming isolation layers on the substrate and removing the mask; and sequentially forming a first dielectric layer pattern and a first control gate on the first structures, and sequentially forming a second dielectric layer pattern and a second control gate on the second structures.

11. The method of claim 10, wherein the coating process is performed under a pressure of about 20 mTorr to about 500 mTorr.

12. The method of claim 10, wherein the coating process is performed using a source gas comprising $CH_xF_y$, $C_xF_y$, $CH_4$ and/or $SiCl_4$, and wherein x and y are positive integers.

13. The method of claim 12, wherein the source gas further includes $O_2$.

14. The method of claim 10, wherein the second preliminary structures have sidewalls that are vertical relative to the top surface of the substrate.

15. The method of claim 10, wherein the first and second preliminary structures have sidewalls that are slanted relative to the top surface of the substrate, and wherein a portion of each sidewall of each first preliminary structure that is not directly under the mask has a width larger than that of a portion of each sidewall of each second preliminary structure that is not directly under the mask.

16. The method of claim 10, wherein the substrate is divided into a cell region and a peripheral circuit region, wherein the first structures, the first dielectric layer pattern and the first control gate are formed in the cell region, and wherein the second structures, the second dielectric layer pattern and the second control gate are formed in the peripheral circuit region.

17. The method of claim 10, wherein forming the isolation layers and removing the mask comprises;

partially removing upper portions of the substrate using the mask and the first and second structures as an etching mask to form trenches;

forming an insulation layer covering the mask and the first and second structures to fill the trenches; and removing an upper portion of the insulation layer and the mask to form the isolation layers.

18. A method of forming patterns on a substrate including a plurality of first preliminary patterns that are spaced apart from each other by a first distance and a plurality of second patterns that are spaced apart from each other by a second distance that is larger than the first distance, wherein the first patterns include first mask portions and first layer portions on the substrate beneath the first mask portions, wherein the second patterns include second mask portions and second layer portions on the substrate beneath the second mask portions, and wherein the first layer portions extend laterally from beneath the first mask portions, the method comprising:

forming first and second coating layers on sidewalls of the first and second patterns, respectively, wherein the first coating layers have a greater thickness than a thickness of the second coating layers, wherein the second coating layer has a width adjacent the substrate that is larger than a width of the first coating layer adjacent the substrate; and etching the first and second coating layers and the first layer portions of the first patterns using the first and second mask portions as an etch mask to reduce an amount by which the first layer portions extend laterally from beneath the first mask portions.

19. The method of claim 1, wherein the first preliminary patterns comprise first preliminary gate structures, the first patterns comprise first gate structures, the second preliminary patterns comprise second preliminary gate structures, and the second patterns comprise second gate structures.

20. The method of claim 1, wherein the second patterns have a second width that is less than a first width of the second preliminary patterns.

* * * * *